(12) United States Patent
Hamaya et al.

(10) Patent No.: US 11,747,722 B2
(45) Date of Patent: Sep. 5, 2023

(54) IMPRINT METHOD, IMPRINT APPARATUS, AND METHOD OF MANUFACTURING ARTICLE

(71) Applicant: CANON KABUSHIKI KAISHA, Tokyo (JP)

(72) Inventors: Zenichi Hamaya, Utsunomiya (JP); Masahiro Tamura, Utsunomiya (JP); Yoshinari Someya, Shioya-gun (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 179 days.

(21) Appl. No.: 16/780,023

(22) Filed: Feb. 3, 2020

(65) Prior Publication Data

US 2020/0264507 A1    Aug. 20, 2020

(30) Foreign Application Priority Data

Feb. 14, 2019    (JP) ................................ 2019-024693

(51) Int. Cl.
| | |
|---|---|
| *G03F 7/00* | (2006.01) |
| *B29C 35/08* | (2006.01) |
| *B29C 59/02* | (2006.01) |

(52) U.S. Cl.
CPC ........ *G03F 7/0002* (2013.01); *B29C 35/0888* (2013.01); *B29C 59/022* (2013.01)

(58) Field of Classification Search
CPC .. B29C 35/0888; B29C 59/022; G03F 7/0002
See application file for complete search history.

(56) References Cited

U.S. PATENT DOCUMENTS

| | | | | |
|---|---|---|---|---|
| 11,009,641 B2 * | 5/2021 | Huang | ....................... | C23C 8/02 |
| 2012/0080820 A1 | 4/2012 | Narioka | | |

FOREIGN PATENT DOCUMENTS

| | | | | |
|---|---|---|---|---|
| JP | 2013251560 A | * | 12/2013 | |
| JP | 5828626 B2 | | 12/2015 | |
| JP | 2016111201 A | * | 6/2016 | |
| WO | WO-2017145924 A1 | * | 8/2017 | ............. B29C 33/72 |

* cited by examiner

*Primary Examiner* — Michael M. Robinson
*Assistant Examiner* — Victoria Bartlett
(74) *Attorney, Agent, or Firm* — ROSSI, KIMMS & McDOWELL LLP

(57) ABSTRACT

The present invention provides an imprint method that performs a process of forming a pattern of an imprint material on a substrate using a mold, for each of a plurality of shot regions on the substrate, the process including: dispensing the imprint material onto the substrate; moving, to below the mold, the substrate on which the imprint material is dispensed; and supplying, in a moving path of the substrate in the moving, a first gas that promotes filling of the imprint material into a pattern of the mold, wherein in a case where a target shot region to be subjected to the process meets a predetermined condition, supplying a second gas having a lower oxygen concentration than air onto the substrate is additionally executed for the target shot region after the supplying the first gas.

18 Claims, 15 Drawing Sheets

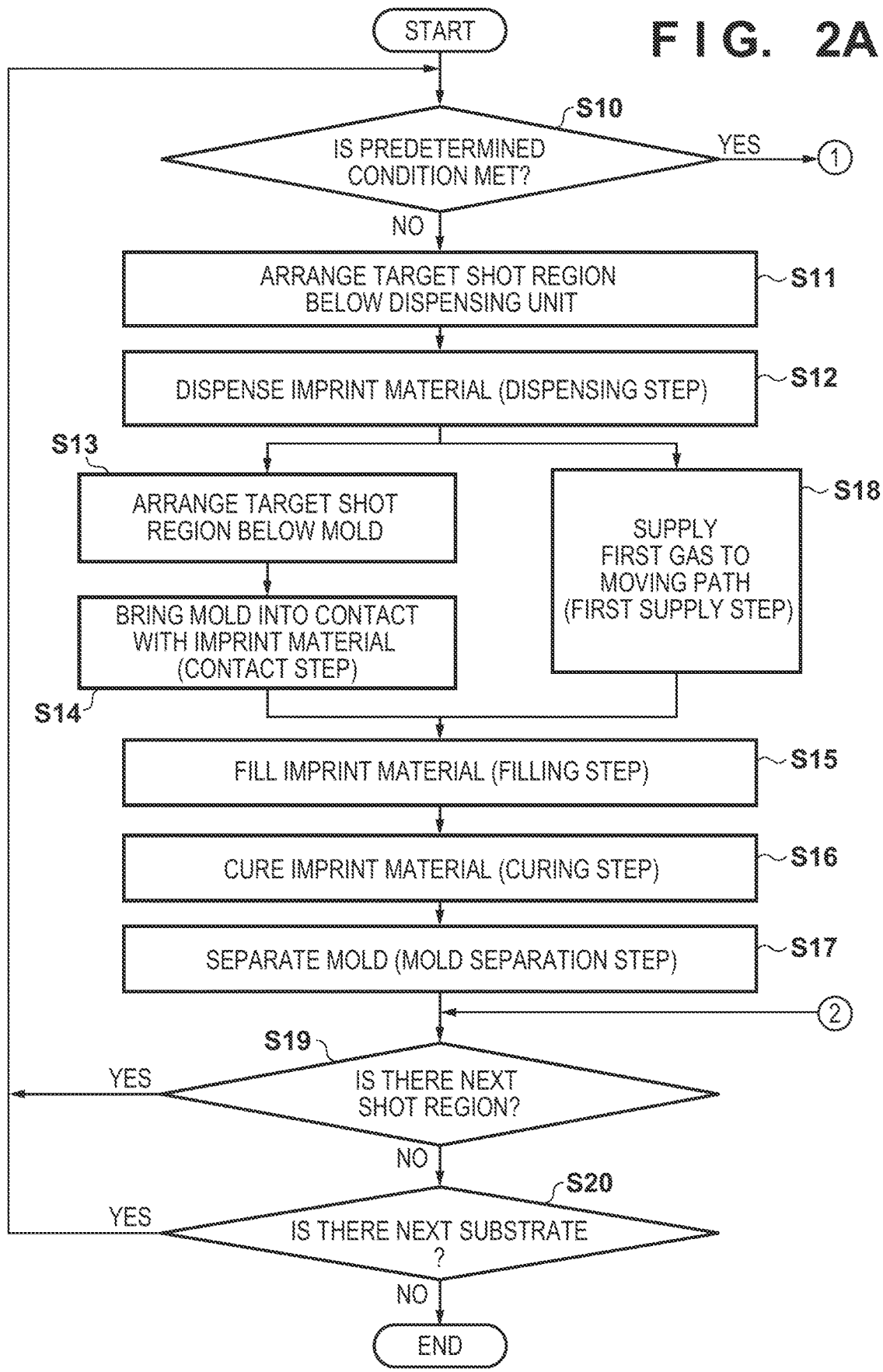

IMPRINT METHOD, IMPRINT APPARATUS, AND METHOD OF MANUFACTURING ARTICLE

BACKGROUND OF THE INVENTION

Field of the Invention

The present invention relates to an imprint method, an imprint apparatus, and a method of manufacturing an article.

Description of the Related Art

An imprint apparatus that forms a pattern of an imprint material on a substrate by using a mold for each of a plurality of shot regions on the substrate has attracted attention as one type of mass-production lithography apparatus for semiconductor devices and the like. The imprint apparatus brings the mold into contact with the imprint material on the substrate, and then cures the imprint material by applying energy such as light or heat to the imprint material to cause a polymerization reaction. Then, the mold is separated from the cured imprint material. Thus, a pattern of the mold can be transferred to the imprint material on the substrate.

In the imprint apparatus, in a contact step of bringing an imprint material on a substrate into contact with a mold, a pattern concave portion of the mold may not be fully filled with the imprint material to leave air bubbles between the mold and the imprint material. In this case, a pattern transfer failure (defect) onto the substrate can occur in a portion in which air bubbles are left. For this reason, in a contact step, the space between the mold and the substrate is preferably filled with a gas (to be sometimes referred to as a filling promotion gas hereinafter) for promoting (accelerating) the filling of the pattern of the mold with the imprint material.

Japanese Patent No. 5828626 has proposed a method of supplying a filling promotion gas to a moving path for moving a substrate with an imprint material dispensed (discharged) thereon to below the mold. This moves a filling promotion gas to below the mold together with the substrate and makes the filling promotion gas efficiently flow into a space between the mold and the substrate.

In the imprint apparatus, for example, if the intensity of light applied to the imprint material is lower than a target value or the light irradiation time is shorter than a target time, the mold may be separated from the imprint material before the imprint material is sufficiently cured. In addition, in order to make it easy to separate the mold from the imprint material, the mold may be intentionally separated from the imprint material before the imprint material is sufficiently cured. Even in such a case, since the polymerization reaction of the imprint material continues even after the mold is separated therefrom, the imprint material can be sufficiently cured as time passes. However, depending on the shot region subjected to the imprint process, compared to other shot regions, the oxygen concentration on the substrate may be high in the step after the mold is separated. Since the imprint material has the property that the polymerization reaction is inhibited by oxygen, if the oxygen concentration on the substrate becomes high, the imprint material is not sufficiently cured and defects are likely to occur in the pattern of the imprint material formed on the substrate.

SUMMARY OF THE INVENTION

The present invention provides, for example, a technique advantageous in reducing failures of patterns of an imprint material formed on a substrate.

According to one aspect of the present invention, there is provided an imprint method that performs a process of forming a pattern of an imprint material on a substrate using a mold, for each of a plurality of shot regions on the substrate, the process including: dispensing the imprint material onto the substrate; moving, to below the mold, the substrate on which the imprint material is dispensed; and supplying, in a moving path of the substrate in the moving, a first gas that promotes filling of the imprint material into a pattern of the mold, wherein in a case where a target shot region to be subjected to the process meets a predetermined condition, supplying a second gas having a lower oxygen concentration than air onto the substrate is additionally executed for the target shot region after the supplying the first gas.

Further features of the present invention will become apparent from the following description of exemplary embodiments with reference to the attached drawings.

BRIEF DESCRIPTION OF THE DRAWINGS

FIGS. 2A to 2B are flowcharts showing an imprint method according to the first embodiment;

DESCRIPTION OF THE EMBODIMENTS

Figure 1:
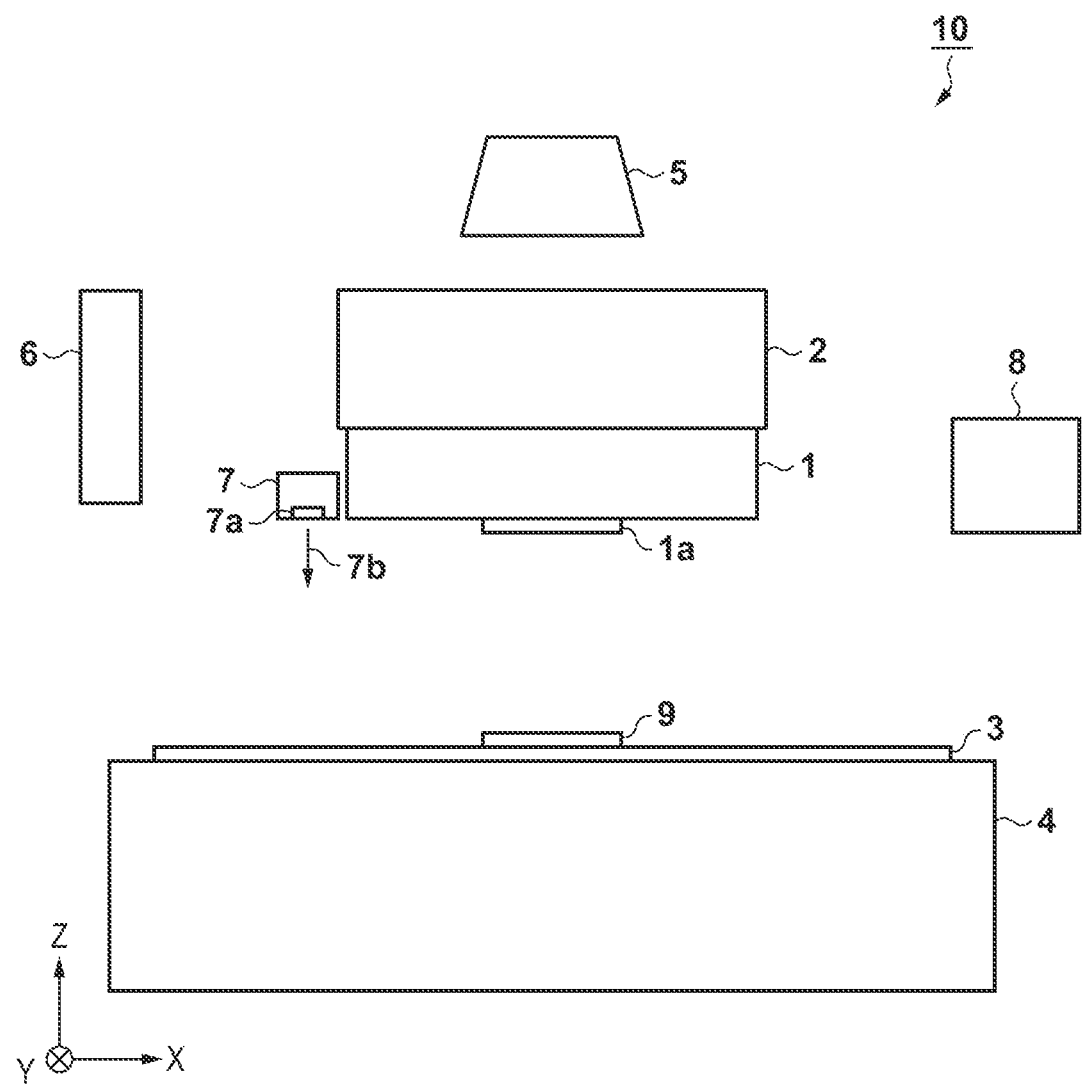
FIG. 1 is a schematic view showing the arrangement of an imprint apparatus.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

Assume that in the following embodiments, two directions orthogonal to each other in a plane direction parallel to the surface of a substrate (a direction along the surface of the substrate) are defined as an X direction and a Y direction, respectively, and a direction perpendicular to the surface of the substrate (a direction along the optical axis of light incident on the substrate) is defined as a Z direction.

First Embodiment

An imprint apparatus according to the first embodiment of the present invention will be described. The imprint apparatus is an apparatus that forms a pattern of a cured product of an imprint material onto which a pattern with protrusions and recesses on a mold is transferred by bringing the imprint material supplied onto a substrate into contact with the mold and applying energy for curing the imprint material. For example, the imprint apparatus supplies an imprint material onto a substrate, and cures the imprint material in a state in which a mold with a pattern with protrusions and recesses formed thereon is in contact with the imprint material on the substrate. Then, the imprint apparatus increases the spacing between the mold and the substrate, thereby separating the mold from the cured imprint material. Thus, the pattern of the mold can be transferred to the imprint material on the substrate. Such a series of processing is called an "imprint process", and is performed for each of a plurality of shot regions on the substrate. That is, when an imprint process is performed for each of a plurality of shot regions on a single substrate, the imprint process is repeatedly performed by the number of shot regions on the single substrate.

As the imprint material, a curable composition (to be also referred to as a resin in an uncured state) to be cured by energy for curing is used. As the energy for curing, an electromagnetic wave, heat, or the like is used. The electromagnetic wave is, for example, light selected from the wavelength range of 10 nm (inclusive) to 1 mm (inclusive). Examples of the electromagnetic wave are infrared light, a visible light beam, and ultraviolet light.

The curable composition is a composition cured by light irradiation or heating. A photo-curable composition cured by light contains at least a polymerizable compound and a photopolymerization initiator, and may contain a nonpolymerizable compound or a solvent as needed. The nonpolymerizable compound is at least one material selected from the group consisting of a sensitizer, a hydrogen donor, an internal mold release agent, a surfactant, an antioxidant, and a polymer component.

The imprint material is applied in a film shape onto the substrate by a spin coater or a slit coater. Alternatively, the imprint material may be applied, onto the substrate, in a droplet shape or in an island or film shape formed by connecting a plurality of droplets using a liquid injection head. The viscosity (the viscosity at 25° C.) of the imprint material can be, for example, 1 mPa·s (inclusive) to 100 mPa·s (inclusive).

[Arrangement of Imprint Apparatus]

An imprint apparatus 10 according to the first embodiment of the present invention will be described next. FIG. 1 is a schematic view showing the arrangement of the imprint apparatus 10 according to the first embodiment. The imprint apparatus 10 can include, for example, a mold stage 2 (mold holding unit) that holds a mold 1, a substrate stage 4 (substrate holding unit) that can move while holding a substrate 3, a curing unit 5, a dispensing unit 6 (dispenser), a supply unit 7, and a control unit 8. The control unit 8 is formed from, for example, a computer including a CPU and a memory, and controls each unit of the imprint apparatus 10 to control an imprint process.

The mold 1 is usually formed from a material capable of transmitting ultraviolet light, such as quartz. In the mold 1, a pattern with protrusions and recesses to be transferred to an imprint material 9 on a substrate is formed in a partial region (pattern region 1a) located on the substrate side surface and protruding toward the substrate side. As the substrate 3, glass, ceramic, a metal, a semiconductor, a resin, or the like is used. A member made of a material different from that of the substrate may be formed on the surface of the substrate, as needed. More specifically, the substrate 3 is a silicon wafer, a semiconductor compound wafer, silica glass, or the like. An adhesive layer may be provided before the addition of an imprint material to improve the adhesiveness between the imprint material and the substrate, as needed.

The mold stage 2 can include, for example, a mold chuck that holds the mold 1 by vacuum suction or the like, and a mold driving unit that drives the mold 1 in the Z direction so as to change the spacing between the mold 1 and the substrate 3. The mold stage 2 of this embodiment is configured to drive the mold 1 in the Z direction, but it may have, for example, a function of driving the mold 1 in the X and Y directions and the θ direction (the rotation direction around the Z axis), or the like.

The substrate stage 4 can include, for example, a substrate chuck that holds the substrate 3 by vacuum suction or the like, and a substrate driving unit that drives the substrate 3 in the X and Y directions. The substrate driving unit of this embodiment is configured to drive the substrate 3 in the X and Y directions by, for example, a linear motor or a planar motor, but it may have, for example, a function of driving the substrate 3 in the Z direction and the θ direction, or the like.

The curing unit 5 (irradiation unit) irradiates the imprint material 9 on the substrate with light (for example, ultraviolet light) via the mold 1 in a state in which the mold 1 is in contact with the imprint material 9 on the substrate, thereby curing the imprint material 9. The dispensing unit 6 dispenses the imprint material toward the substrate 3 arranged below the dispensing unit 6 by the substrate stage 4 (supplies (applies) the imprint material onto the substrate).

[Imprint Method]

Figure 2B:
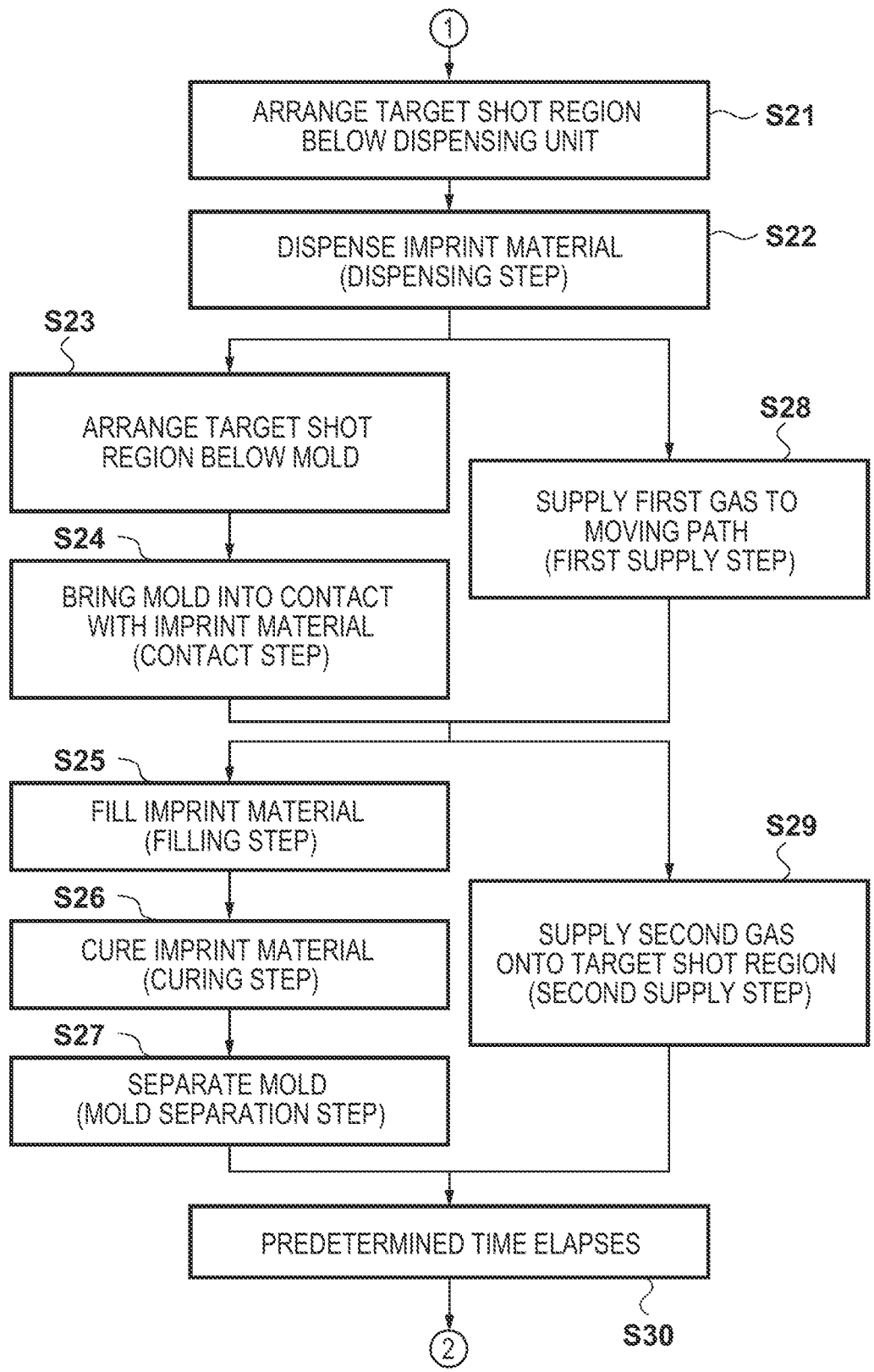

Next, an imprint method performed by the imprint apparatus 10 of this embodiment will be described with reference to FIGS. 2A to 2B. FIGS. 2A to 2B is a flowchart showing the imprint method according to this embodiment. The respective steps in the flowchart shown in FIGS. 2A to 2B can be controlled by the control unit 8.

In step S10, the control unit 8 determines whether a shot region (to be referred to as a target shot region hereinafter) subjected to an imprint process among a plurality of shot regions on the substrate 3 meets a predetermined condition. If the target shot region does not meet the predetermined condition, the imprint process in the first mode (normal mode) (steps S11 to S18) is performed on the target shot region. On the other hand, if the target shot region meets the predetermined condition, the imprint process in the second mode (steps S21 to S30) is performed on the target shot region. Note that the predetermined condition in this step and the imprint process in the second mode will be described later.

In step S11, the control unit 8 causes the substrate stage 4 to move the substrate 3 such that the target shot region is arranged below the dispensing unit 6 (moving step). In step S12, the control unit 8 controls the dispensing unit 6 to dispense the imprint material 9 onto the target shot region (dispensing step). In step S13, the control unit 8 causes the substrate stage 4 to move the substrate 3 such that the target shot region with the imprint material 9 arranged thereon by the dispensing unit 6 is arranged below the pattern region 1a of the mold 1 (moving step).

Steps S14 to S17 are included in a formation step in which the mold 1 is brought into contact with the imprint material on the substrate and the imprint material is cured, thereby forming a pattern on the imprint material. In step S14, the control unit 8 controls the mold stage 2 to decrease the spacing (Z direction) between the mold 1 and the substrate 3 to a target spacing, thereby increasing the contact area between the mold 1 and the imprint material 9 on the target shot region (contact step). In step S15, the control unit 8 allows a predetermined time to elapse while maintaining the spacing between the mold 1 and the substrate 3 at the target spacing, thereby filling the pattern concave portion of the mold 1 with the imprint material 9 (filling step). In step S16, the control unit 8 controls the curing unit 5 to irradiate the imprint material 9 with light (ultraviolet light) in a state in which the mold 1 is in contact with the imprint material 9 on the target shot region, thereby curing the imprint material 9 on the target shot region (curing step). In step S17, the control unit 8 controls the mold stage 2 to increase the spacing (Z direction) between the mold 1 and the substrate 3, thereby separating the mold 1 from the cured imprint material 9 (mold separation step).

In step S19, the control unit 8 determines whether a shot region (to be referred to as a next shot region hereinafter) to be subjected to the imprint process exists on the substrate held by the substrate stage 4. If a next shot region exists on the substrate, the process returns to step S10, and if no next shot region exists on the substrate (if the imprint process is completed for all the shot regions on the substrate), the process advances to step S20. In step S20, the control unit 8 determines whether there is a substrate (to be referred to as a next substrate) to be subjected to the imprint process next. If there is a next substrate, the process returns to step S10 after changing the substrate on the substrate stage 4 by a substrate carrying unit (not shown). If there is no next substrate, the process is terminated.

[Supply of Filling Promotion Gas]

Generally, in the imprint apparatus, if a pattern concave portion of the mold 1 is not fully filled with the imprint material 9 and air bubbles are left between the mold 1 and the imprint material 9, a pattern transfer failure (defect) onto the substrate can occur in a portion in which air bubbles are left. For this reason, in the imprint apparatus, the space between the mold 1 and the substrate 3 is preferably filled with a first gas (to be referred to as a filling promotion gas hereinafter) for promoting the filling of the pattern concave portion of the mold 1 with the imprint material 9 in the contact step (step S14). Examples of the filling promotion gas that can be used include a gas having a small molecular weight and high permeability with respect to the mold, such as helium gas, and a gas (that is, a condensable gas) that liquefies when the mold comes into contact with the imprint material on the substrate, such as PFP (pentafluoropropane) gas.

In the imprint apparatus 10 of this embodiment, the supply unit 7 that supplies the filling promotion gas is provided in the moving path of the substrate 3 for moving the target shot region of the substrate 3 from below the dispensing unit 6 to below the mold 1 (step S13). The supply unit 7 can supply a filling promotion gas 7b to the moving path by, for example, blowing out the filling promotion gas 7b from an outlet 7a (supply port) arranged between the mold stage 2 and the dispensing unit 6. Since the filling promotion gas supplied to the moving path as described above moves with the movement of the substrate 3 due to its viscosity, the filling promotion gas can be efficiently flown into the narrow space between the mold 1 and the substrate 3.

Incidentally, since such a filling promotion gas is very expensive, in the imprint apparatus, it is preferable that while the substrate 3 is moved, the filling promotion gas is not constantly supplied to the moving path but is supplied to the moving path in a necessary amount required for each contact step. That is, in the imprint apparatus, it is preferable that the necessary amount (predetermined amount) of the filling promotion gas required for each contact step is determined in advance by an experiment or simulation and the determined necessary amount of the filling promotion gas is supplied to the moving path at a predetermined timing.

Figure 3:
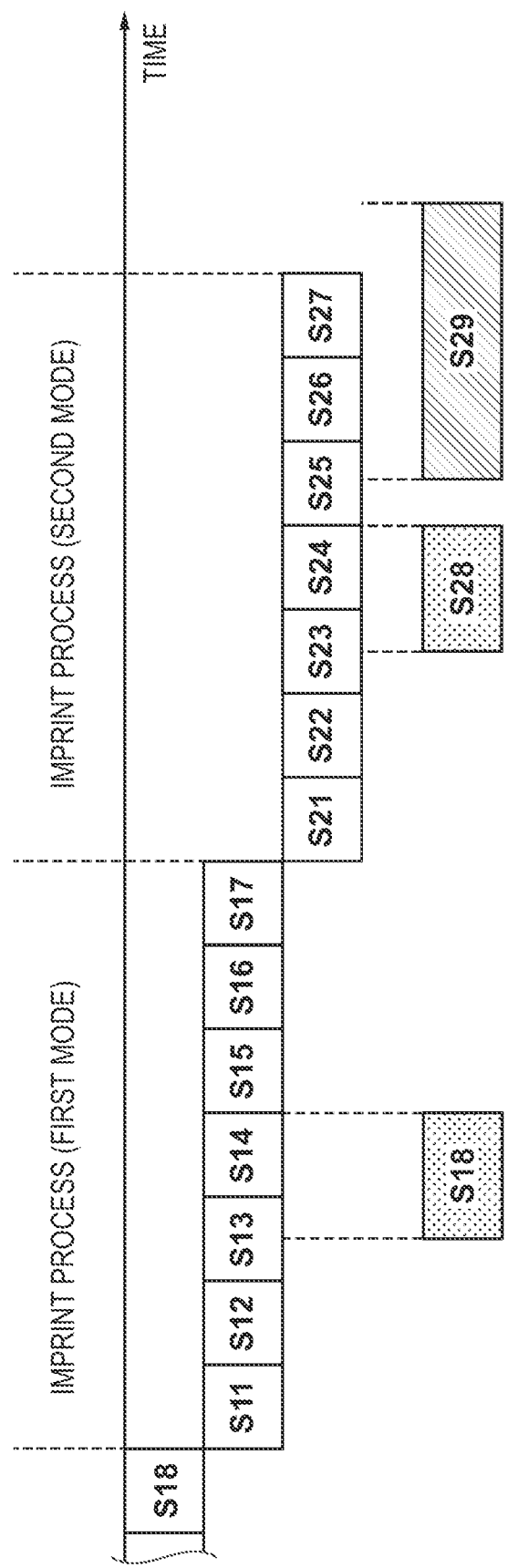
FIG. 3 is a timing chart showing the respective steps in the imprint method according to the first embodiment.

In this embodiment, as shown in FIGS. 2A to 2B and 3, the first supply step (step S18) of supplying the filling promotion gas in the necessary amount (predetermined amount) determined in advance to the moving path of the substrate 3 by the supply unit 7 is executed in the period of the moving step (step S13) and the contact step (step S14). FIG. 3 shows an example of the timing chart showing the respective steps in the flowchart shown in FIGS. 2A to 2B, and the step numbers in FIG. 3 correspond to the step numbers of the respective steps in FIGS. 2A to 2B. For example, the control unit 8 can control the amount of filling promotion gas supplied to the moving path of the substrate 3 using the supply start timing and supply end timing of the filling promotion gas. More specifically, the control unit 8 starts supplying the filling promotion gas to the moving path at the timing when the target shot region reaches the outlet 7a. Then, the control unit 8 stops supplying the filling promotion gas at the timing when the target shot region is arranged below the pattern region 1a of the mold 1 and the movement of the substrate stage 4 (substrate 3) is completed.

[Additional Supply of Filling Promotion Gas]

In the imprint apparatus 10, for example, if the intensity of light applied to the imprint material is lower than a target value or the light irradiation time is shorter than a target time, the mold 1 may be separated from the imprint material before the imprint material is sufficiently cured. In addition, in order to make it easy to separate the mold 1 from the imprint material, the mold 1 may be intentionally separated from the imprint material before the imprint material is sufficiently cured. Even in such a case, since the polymerization reaction of the imprint material continues even after the mold is separated therefrom, the imprint material can be sufficiently cured as time passes. However, depending on the shot region subjected to the imprint process, compared to other shot regions, the oxygen concentration on the substrate may become high in the step after the mold 1 is separated. Since the imprint material has the property that the polymerization reaction is inhibited by oxygen, if the oxygen concentration on the substrate becomes high, the imprint material is not sufficiently cured and defects are likely to occur in the pattern of the imprint material formed on the substrate.

Figure 4:
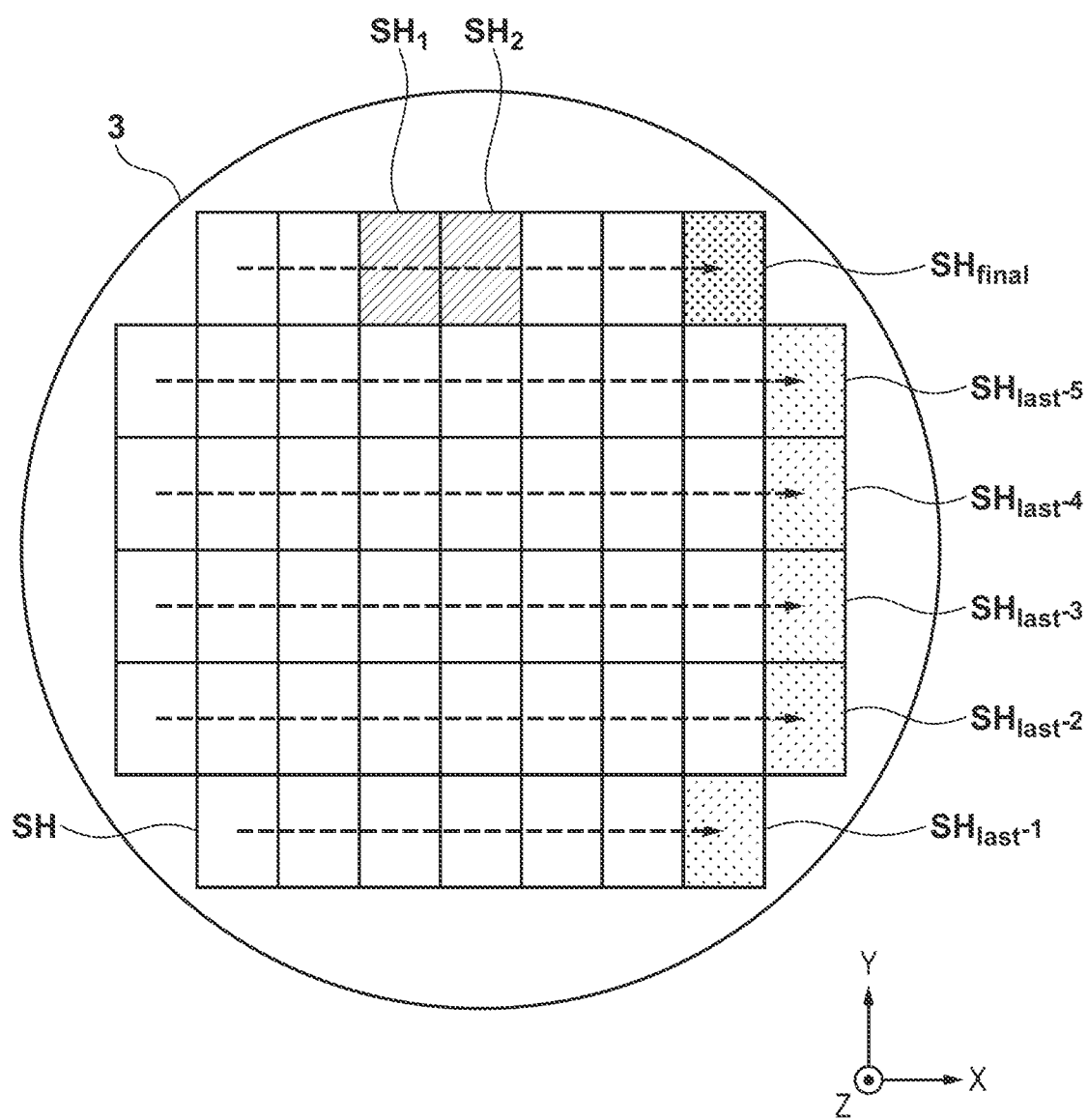
FIG. 4 is a view showing an arrangement example of a plurality of shot regions on a substrate.

Here, the difference in oxygen concentration on the substrate in the step after the mold 1 is separated will be described. FIG. 4 is a view showing an arrangement example of a plurality of shot regions SH on the substrate 3, and the order of performing the imprint process on the plurality of shot regions SH is indicated by broken-line arrows. In the following, a description will be given focusing on a shot region $SH_{final}$ (final shot region) on which the imprint process is performed last among the plurality of shot regions SH on the substrate 3 and a shot region $SH_1$ different from the shot region $SH_{final}$.

After the imprint process (separation step) on the shot region $SH_1$ is completed, the substrate 3 is moved from below the mold 1 to below the dispensing unit 6 in order to perform the imprint process (dispensing step) on a next shot region $SH_2$. Since the moving space of the substrate 3 from below the mold 1 to below the dispensing unit 6 is filled with the filling promotion gas supplied from the supply unit 7 during the imprint process (first supply step) on the shot region $SH_1$, the oxygen concentration is low. Therefore, the polymerization reaction is hardly inhibited in the imprint material on the shot region $SH_1$ after the separation step, so that the imprint material can be sufficiently cured.

On the other hand, after the imprint process (separation step) on the shot region $SH_{final}$ is completed, the substrate 3 is moved not below the dispensing unit 6 but to an unloading position for unloading it from the imprint apparatus 10. However, since the moving space of the substrate 3 to the unloading position is, for example, an air atmosphere, the oxygen concentration is high. Therefore, in the imprint material on the shot region $SH_{final}$ after the separation step, the polymerization reaction is likely to be inhibited and the imprint material can be insufficiently cured.

Therefore, the imprint apparatus 10 of this embodiment determines whether the target shot region meets the predetermined condition (step S10). If the target shot region meets the predetermined condition, the imprint process in the second mode (steps S21 to S30) is performed on the target shot region. In the imprint process in the second mode, the second supply step (step S29) of supplying, onto the substrate, a second gas having a lower oxygen concentration than air is added after the first supply step (step S28) as compared with the imprint process in the first mode (steps S11 to S18).

The imprint process in the second mode (steps S21 to S30) will be described below with reference to FIGS. 2A to 2B and 3. In this embodiment, a condition that the target shot region is the final shot region is used as the predetermined condition in strep S10. That is, in step S10, the control unit 8 determines whether the target shot region is the final shot region. If the target shot region is not the final shot region, the imprint process in the first mode (steps S11 to S18) is performed. If the target shot region is the final shot region, the imprint process in the second mode (steps S21 to S30) is performed.

Here, the final shot region can be a shot region (shot region $SH_{final}$ in FIG. 4) on which the imprint process is performed last among all the plurality of shot regions on the substrate 3, but is not limited to this. The final shot region may be, for example, any one of shot regions (shot regions $SH_{last}$-1 to $SH_{last}$-5 in FIG. 4) on which the imprint process is performed last in a shot region array in which the imprint process is continuously performed. This is because, in the shot region on which the imprint process is performed last in the shot region array, the oxygen concentration tends to be high after the separation step due to the movement of the substrate 3 in the Y direction for changing the shot region array. The shot region array is, for example, a group of shot regions arranged along the moving direction (X direction in FIG. 3) of the substrate 3 in the moving step.

Steps S21 to S28 in the imprint process in the second mode are similar to steps S11 to S18 in the imprint process in the first mode. In the imprint process in the second mode, as in the imprint process in the first mode, the first supply step (step S28) of supplying the filling promotion gas in the necessary amount determined in advance to the moving path of the substrate 3 by the supply unit 7 is executed in the period of the moving step (step S23) and the contact step (step S24).

In step S29, the control unit 8 controls supply of the second gas having a lower oxygen concentration than air (second supply step) in the imprint process in the second mode. For example, in order to supply the minimum amount of the second gas necessary to reduce the inhibition of the polymerization reaction of the imprint material onto the substrate before the mold separation step (step S27) is started, the control unit 8 starts the second supply step before the mold separation step. In the example shown in FIG. 3, the second supply step (step S29) is started in the middle of the filling step (step S25) after a predetermined time has elapsed since the first supply step (step S28) is completed, and executed over the period of the curing step (step S26) and the mold separation step (step S27). Here, as the second gas used in the second supply step, the effect of reducing the inhibition of the polymerization reaction of the imprint material can be obtained if the gas has a lower oxygen concentration than air, but the lower the oxygen concentration of the second gas is, the better it is. In this embodiment, the filling promotion gas (first gas) can be applied as the second gas, but an inert gas such as nitrogen gas may also be applied. Further, in this embodiment, the second gas is supplied by the supply unit 7 that supplies the filling promotion gas (first gas), but the present invention is not limited to this. A mechanism for supplying the second gas may be provided separately from the supply unit 7.

In step S30, the control unit 8 allows a predetermined time to elapse after the mold separation step (step S27) is completed. The predetermined time in this step can be determined (set) to, for example, be a time until the imprint material is cured to a target hardness when the polymerization reaction of the imprint material is continuously performed in the atmosphere of the second gas after the mold separation step. The predetermined time can be determined by an experiment or simulation. If the predetermined time has elapsed after the mold separation step is completed, the process advances to step S19.

[Supply Control of Second Gas]

Next, supply control of the second gas by the supply unit 7 will be described. For example, the control unit 8 can control supply of the second gas by the supply unit 7 based on a flow velocity Vf [m/sec] of the second gas blown out from the supply unit 7 and a time Ta [sec] until the second gas blown out from the supply unit 7 reaches the target shot region. More specifically, when the distance (X direction) from the supply unit 7 to the target shot region is Dx [m], the time Ta is determined by Ta=Dx/Vf. The control unit 8 controls the supply unit 7 to, for example, start supplying the second gas at least the arrival time Ta before the start timing of the mold separation step. This can reduce the inhibition of the polymerization reaction of the imprint material that can occur after the mold separation step is started.

In addition, the control unit 8 can control the supply amount of the second gas based on a flow rate Q [m³/sec] of the second gas blown out from the supply unit 7 per unit time and a time Tb for blowing out a necessary amount of the second gas from the supply unit 7. The necessary amount of the second gas can be set to, for example, the volume of the space defined by the spacing between the mold 1 and the substrate 3 and the distance from the supply unit 7 to the imprint material on the target shot region. In this case, when the spacing (Z direction) between the target shot region and the mold 1 is Dgz [m], the length of the target shot region in the Y direction is Ly [m], and the distance (X direction) from the supply unit 7 to the target shot region is Dx [m], the necessary amount of the second gas is obtained by Dx×Ly×Dgz. That is, the time Tb for blowing out the necessary amount of the second gas from the supply unit 7 at the flow rate Q [m$^3$/sec] is determined by Tb=(Dx×Ly×Dgz)/Q. The control unit 8 controls the supply unit 7 to, for example, start supplying the second gas at least the time Tb before the start timing of the mold separation step. This can reduce the inhibition of the polymerization reaction of the imprint material that can occur after the mold separation step is started.

As described above, the imprint apparatus 10 of this embodiment performs the imprint process in the first mode for the shot regions other than the final shot region, and performs the imprint process in the second mode for the final shot region. Further, in the imprint process in the second mode, the second supply step of supplying the second gas having a lower oxygen concentration than air onto the substrate is added after the first supply step as compared to the imprint process in the first mode. Thus, in the imprint material on the final shot region, the inhibition of the polymerization reaction due to oxygen that can occur after the mold separation step can be reduced, and the imprint material can be sufficiently cured.

Second Embodiment

An imprint apparatus according to the second embodiment of the present invention will be described. In the first embodiment, the example has been described in which the second supply step (step S29) is executed after the predetermined time has elapsed since the first supply step (step S28) is completed in the imprint process in the second mode. In this embodiment, an example in which the first supply step (step S28) and the second supply step (step S29) are continuously executed in the imprint process in the second mode will be described with reference to FIGS. 5 and 6. Here, the arrangement of the imprint apparatus according to this embodiment is similar to the arrangement of the imprint apparatus 10 according to the first embodiment, so that the description thereof will be omitted.

Figure 5:
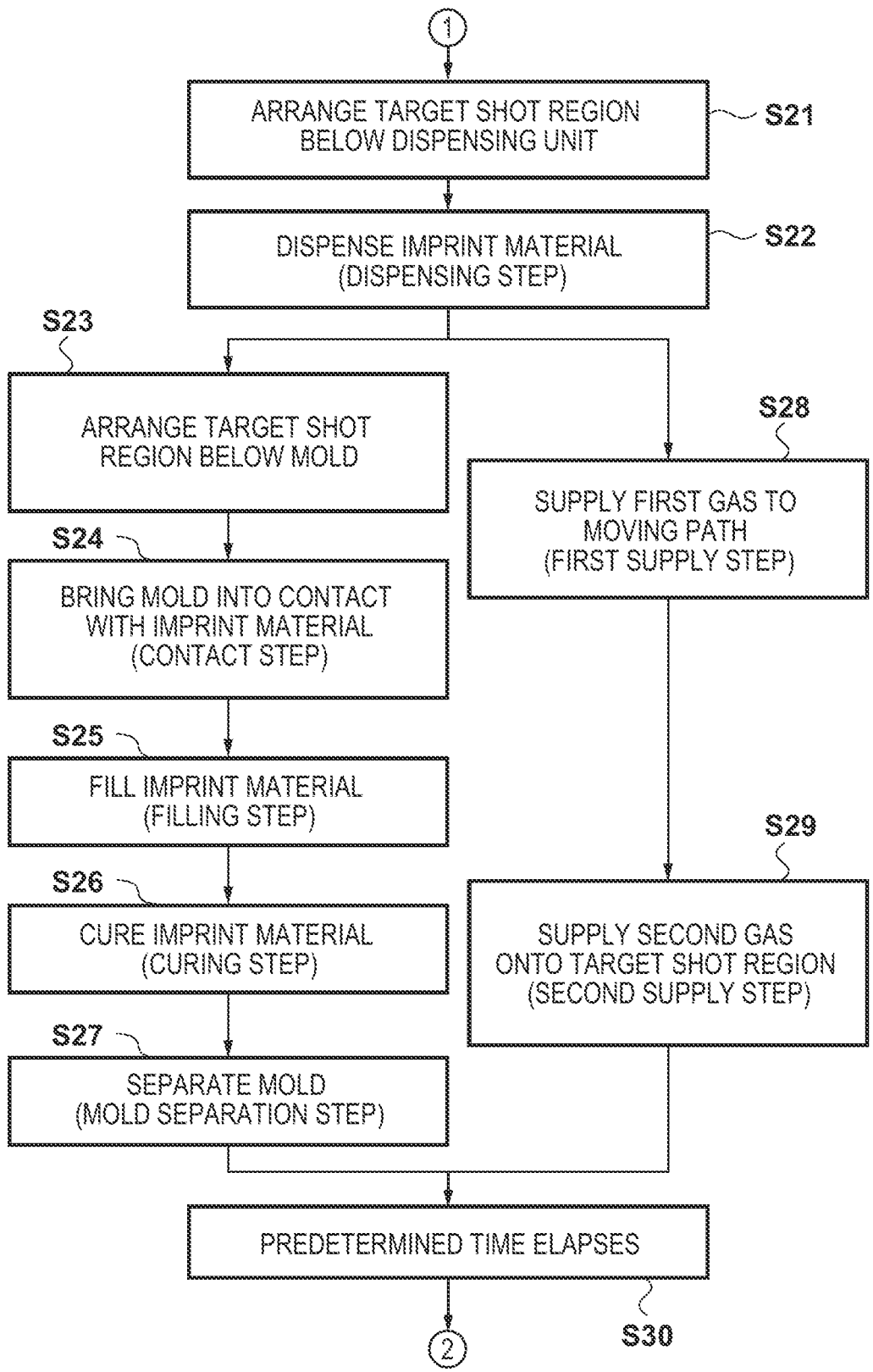
FIG. 5 is a flowchart showing an imprint method according to the second embodiment.
Figure 6:
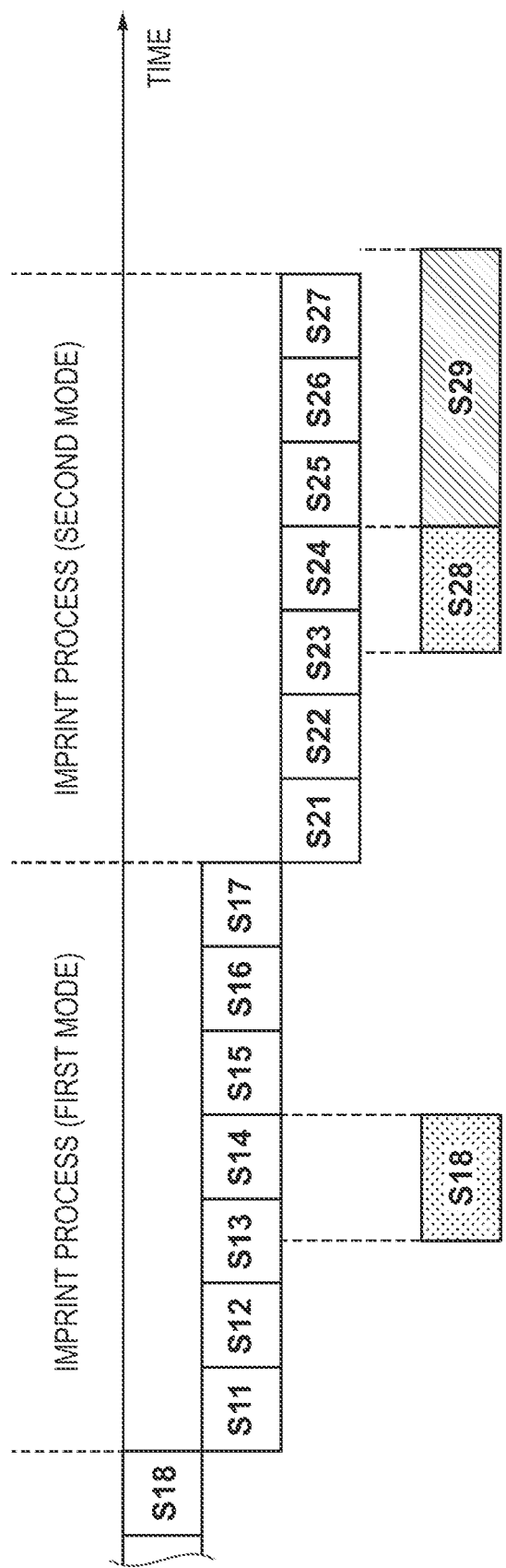
FIG. 6 is a timing chart showing the respective steps in the imprint method according to the second embodiment.

FIG. 5 is a flowchart showing the imprint method (the imprint process in the second mode) according to this embodiment. The respective steps in the flowchart shown in FIG. 5 can be controlled by a control unit 8. FIG. 6 shows an example of the timing chart showing the respective steps in the flowchart shown in FIG. 5, and the step numbers in FIG. 6 correspond to the step numbers of the respective steps in FIG. 5. Here, in this embodiment, the start timing of the second supply step (step S29) in the imprint process in the second mode is different from that in the first embodiment (FIGS. 2A to 2B and 3), and the other steps (steps S10 to S28 and S30) are similar to those in the first embodiment. The start timing of the second supply step (step S29) different from that in the first embodiment will be described below.

In this embodiment, as shown in FIGS. 5 and 6, the second supply step (step S29) of supplying the second gas onto the substrate is executed continuously to the first supply step (step S28) of supplying the filling promotion gas to the moving path of a substrate 3. That is, there is no gas supply stop period between the first supply step (step S28) and the second supply step (step S29). Here, in this embodiment, the filling promotion gas (first gas) can be applied as the second gas as in the first embodiment, but an inert gas such as nitrogen gas may also be applied.

A supply unit 7 is generally provided with a mass flow controller (MFC), and supply of the filling promotion gas from the supply unit 7 is controlled by opening and closing a valve of the MFC. That is, in this embodiment, the filling promotion gas is continuously supplied without opening and closing the MFC valve, that is, without stopping the supply of the filling promotion gas from the supply unit 7 in the first supply step and the second supply step. This can reduce the number of opening and closing operations of the valve of the MFC provided in the supply unit 7, so that the possibility of failure of the MFC can be reduced. Further, by supplying the filling promotion gas without interruption, the filling promotion gas existing between the mold 1 and the substrate 3 can be maintained at a high concentration (that is, an increase in oxygen concentration can be reduced). Therefore, the polymerization reaction of the imprint material on the final shot region after the mold separation step is performed smoothly and rapidly, so that the time required to sufficiently cure the imprint material can be shortened.

Third Embodiment

An imprint apparatus according to the third embodiment of the present invention will be described. In this embodiment, the end timing of the second supply step (step S29) in the imprint process in the second mode will be described with reference to FIGS. 7 and 8. Here, the arrangement of the imprint apparatus according to this embodiment is similar to the arrangement of the imprint apparatus 10 according to the first embodiment, so that the description thereof will be omitted.

Figure 7:
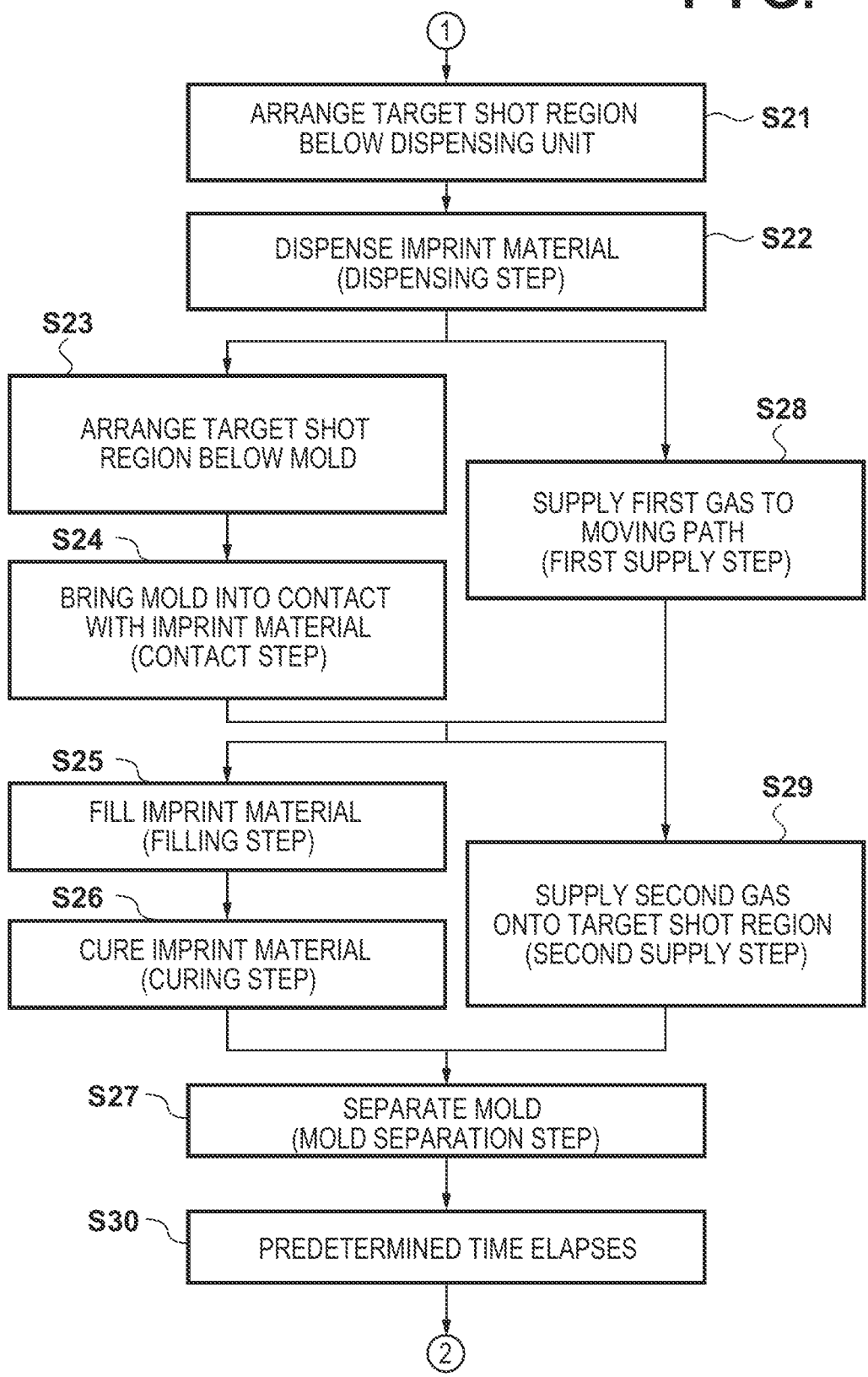
FIG. 7 is a flowchart showing an imprint method according to the third embodiment.
Figure 8:
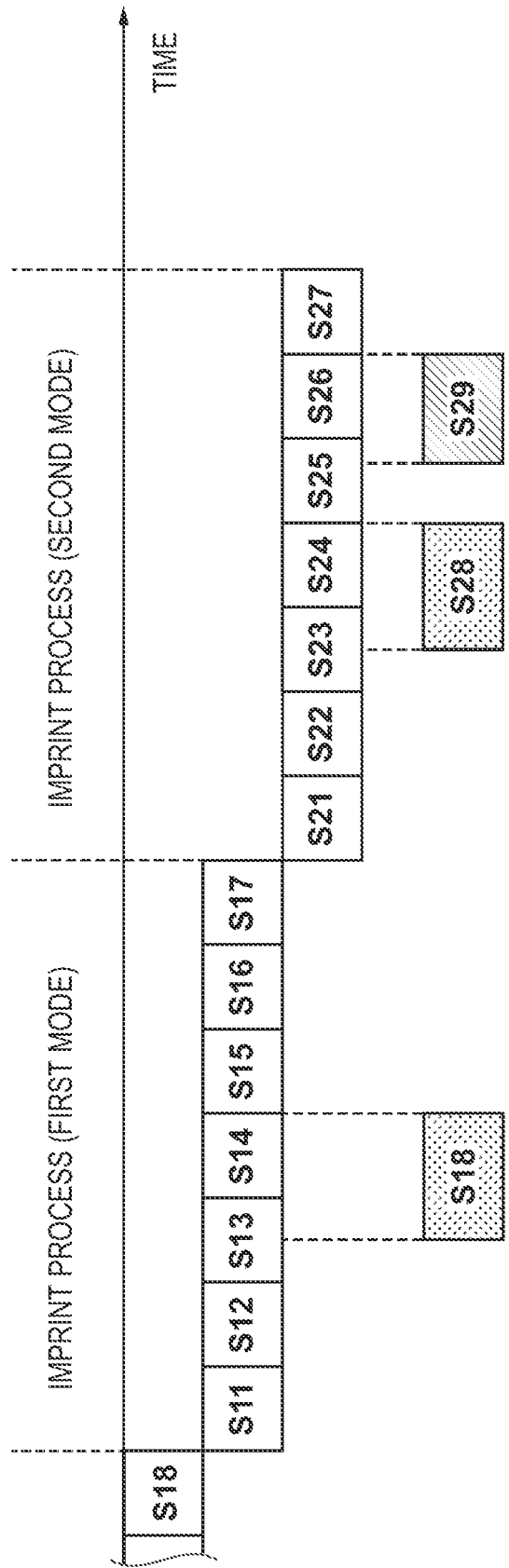
FIG. 8 is a timing chart showing the respective steps in the imprint method according to the third embodiment.

FIG. 7 is a flowchart showing the imprint method (the imprint process in the second mode) according to this embodiment. The respective steps in the flowchart shown in FIG. 7 can be controlled by a control unit 8. FIG. 8 shows an example of the timing chart showing the respective steps in the flowchart shown in FIG. 7, and the step numbers in FIG. 8 correspond to the step numbers of the respective steps in FIG. 7. Here, in this embodiment, the end timing of the second supply step (step S29) in the imprint process in the second mode is different from that in the first and second embodiments, and the other steps (steps S10 to S28 and S30) are similar to those in the first and second embodiments. The end timing of the second supply step (step S29) different from that in the first and second embodiments will be described below.

In this embodiment, as shown in FIGS. 7 and 8, the second supply step (step S29) of supplying the second gas onto the substrate is executed in the period of the filling step (step S25) and the curing step (step S26), but not executed in the period of the mold separation step (step S27). For example, the second supply step (step S29) can be controlled so that its end timing is at the start of the mold separation step (step S27). Further, in this embodiment, as to the start timing of the second supply step, the second supply step is started after a predetermined time has elapsed since the first supply step (step S28) is completed as in the first embodiment, but the present invention is not limited to this. For example, as in the second embodiment, the second supply step may be started continuously to the first supply step.

In the mold separation step, the spacing (Z direction) between a mold 1 and a substrate 3 is increased, so that the space between the mold 1 and the substrate 3 is reduced to a negative pressure and the gas around the mold 1 is drawn into the space. In this embodiment, by utilizing the gas drawing into the space in the mold separation step as described above, the second gas blown out from a supply unit 7 can be efficiently and rapidly supplied to the space between the mold 1 and the substrate 3, so that the use amount of the second gas can be reduced.

Here, supply control of the second gas in this embodiment will be described. For example, the control unit 8 can control the supply amount of the second gas based on a flow rate Q [m$^3$/sec] of the second gas blown out from the supply unit 7 per unit time and a time Tc for blowing out the necessary amount of the second gas from the supply unit 7. In this embodiment, the necessary amount of the second gas can be set to an amount by which the volume of the space between the mold 1 and the substrate 3 is increased by the mold separation step. In this case, when the facing area between the mold 1 and the substrate 3 is A [m$^2$] and the change amount of the spacing (Z direction) between the mold 1 and the substrate is Dmz [m], the necessary amount of the second gas is obtained by A×Dmz. That is, the time Tc for blowing out the necessary amount of the second gas from the supply unit 7 at the flow rate Q [m$^3$/sec] is determined by Tc=(A×Dmz)/Q. The control unit 8 controls the supply unit 7 to, for example, start supplying the second gas at least the time Tc before the start timing of the mold separation step. This can reduce the inhibition of the polymerization reaction of the imprint material that can occur after the mold separation step is started.

Fourth Embodiment

An imprint apparatus according to the fourth embodiment of the present invention will be described. In this embodiment, an example in which the second supply step is executed after the target shot region (final shot region) is moved below the supply unit after the mold separation step in the imprint process in the second mode will be described with reference to FIGS. 9 and 10. Here, the arrangement of the imprint apparatus according to this embodiment is similar to the arrangement of the imprint apparatus 10 according to the first embodiment, so that the description thereof will be omitted.

Figure 9:
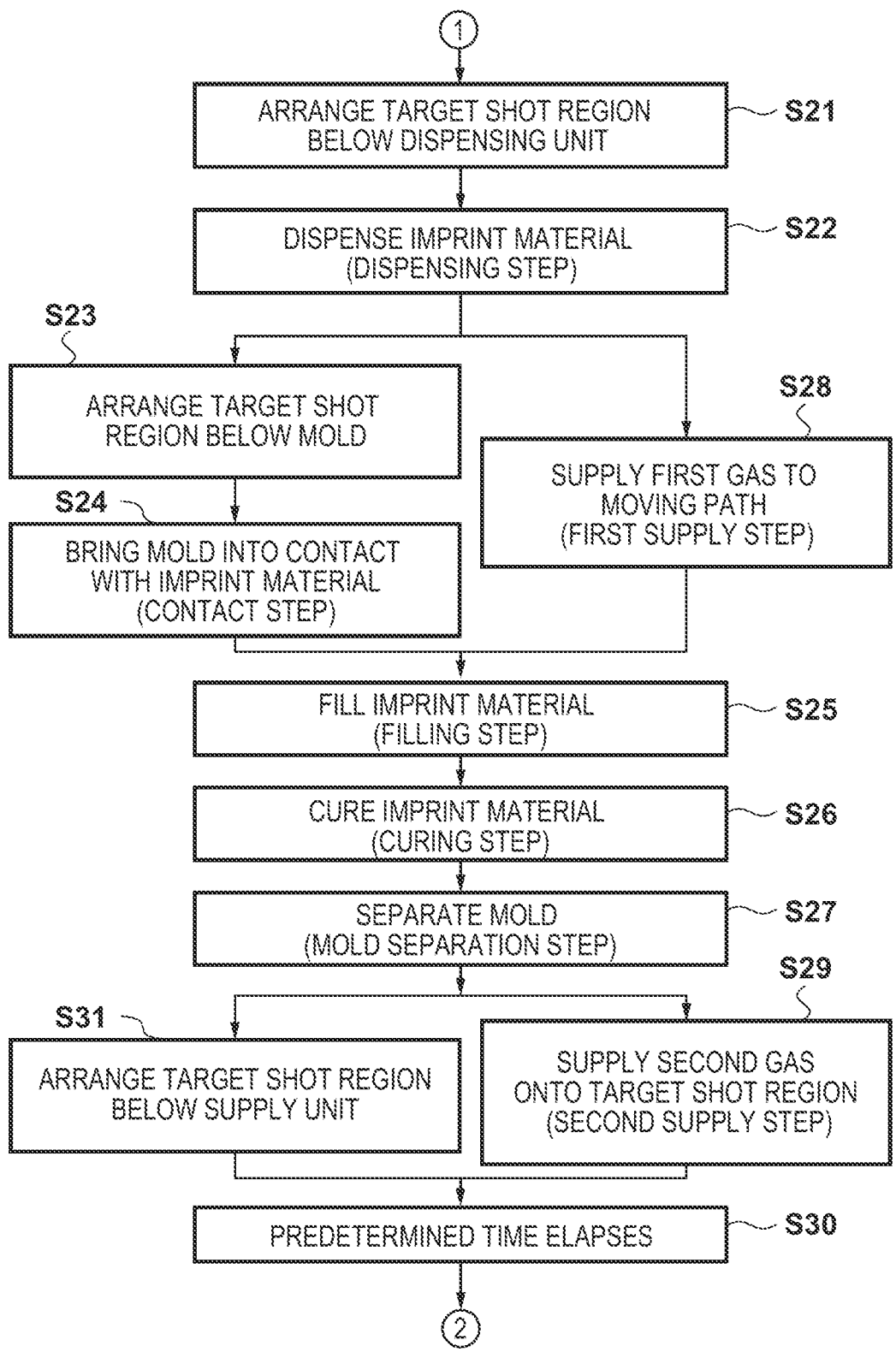
FIG. 9 is a flowchart showing an imprint method according to the fourth embodiment.
Figure 10:
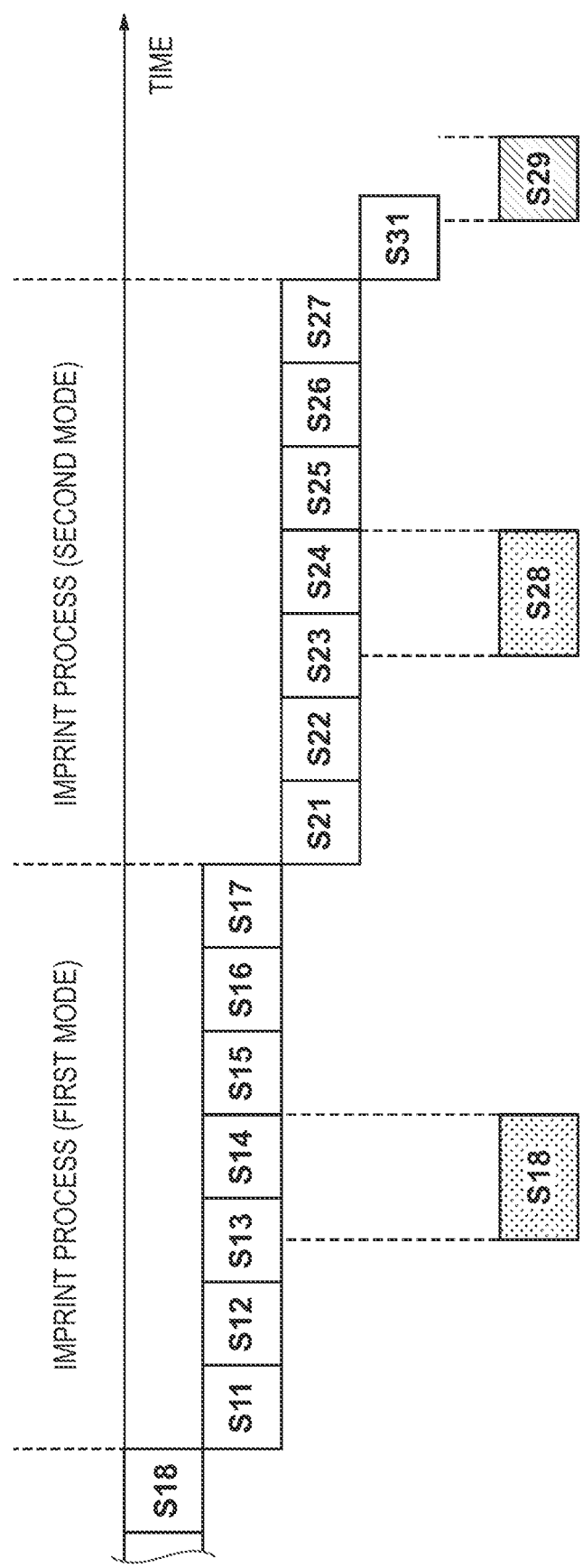
FIG. 10 is a timing chart showing the respective steps in the imprint method according to the fourth embodiment.

FIG. 9 is a flowchart showing the imprint method (the imprint process in the second mode) according to this embodiment. The respective steps in the flowchart shown in FIG. 9 can be controlled by a control unit 8. FIG. 10 shows an example of the timing chart showing the respective steps in the flowchart shown in FIG. 9, and the step numbers in FIG. 10 correspond to the step numbers of the respective steps in FIG. 9. Here, in this embodiment, the execution timing of the second supply step (step S29) in the imprint process in the second mode is different from that in the first to third embodiments, and the other steps (steps S10 to S28 and S30) are similar to those in the first to third embodiments. The execution timing of the second supply step (step S29) different from that in the first to third embodiments will be described below.

If the mold separation step (step S27) is completed, the process advances to step S31, and the control unit 8 arranges the target shot region (final shot region) at a position where the second gas blown out from a supply unit 7 directly hits it. In this embodiment, the position where the second gas directly hits the target shot region is below the supply unit 7 (outlet 7a). Further, the control unit 8 executes the second supply step (step S29) in parallel with step S31. In this embodiment, the second supply step (step S29) is started in the middle of step S31 as shown in FIG. 10. However, the present invention is not limited to this, and the second supply step may be started in the middle of the mold separation step (step S27) or when the mold separation step (step S27) is started. In this manner, by executing the second supply step after the target shot region is arranged at a position where the second gas directly hits it, the second gas blown out from the supply unit 7 can be efficiently supplied onto the target shot region, so that the use amount of the second gas can be reduced.

Here, supply control of the second gas in this embodiment will be described. For example, the control unit 8 can control supply of the second gas by the supply unit 7 based on a flow velocity Vf [m/sec] of the second supply gas blown out from the supply unit 7 and a time Td [sec] until the second gas blown out from the supply unit reaches the moved target shot region. More specifically, when the distance (Z direction) from the supply unit 7 to the moved target shot region is Dz [m], the time Td is determined by Td=Dz/Vf. The control unit 8 controls the supply unit 7 to, for example, supply the second gas for at least the time Td. This can reduce the inhibition of the polymerization reaction of the imprint material that can occur after the mold separation step.

Fifth Embodiment

An imprint apparatus according to the fifth embodiment of the present invention will be described. In the imprint process in the first mode, if the imprint apparatus stops unexpectedly after the mold separation step, as time passes after the mold separation step is completed, the concentration of the filling promotion gas on the target shot region can decrease and the oxygen concentration thereon can increase. In this case, the polymerization reaction of the imprint material after the mold separation step is likely to be inhibited, and it can be difficult to sufficiently cure the imprint material. Therefore, in this embodiment, in the imprint process in the first mode, if the elapsed time since the mold separation step is completed is equal to or larger than a threshold, the third supply step of supplying a third gas having a lower oxygen concentration than air onto the substrate is executed. Here, the arrangement of the imprint apparatus according to this embodiment is similar to the arrangement of the imprint apparatus 10 according to the first embodiment, so that the description thereof will be omitted.

Figure 11A:
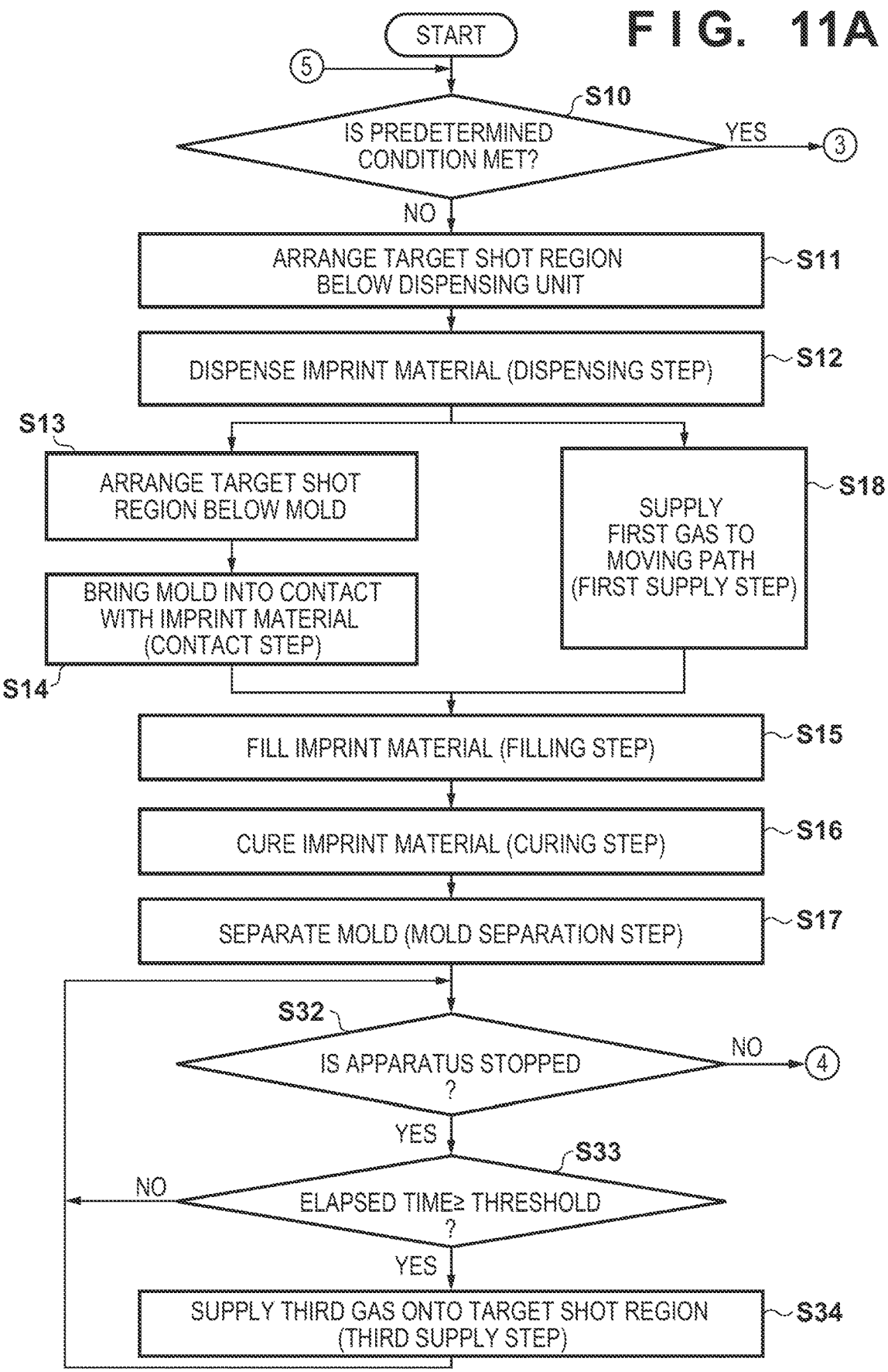
FIGS. 11A to 11B are flowcharts showing an imprint method according to the fifth embodiment.
Figure 11B:
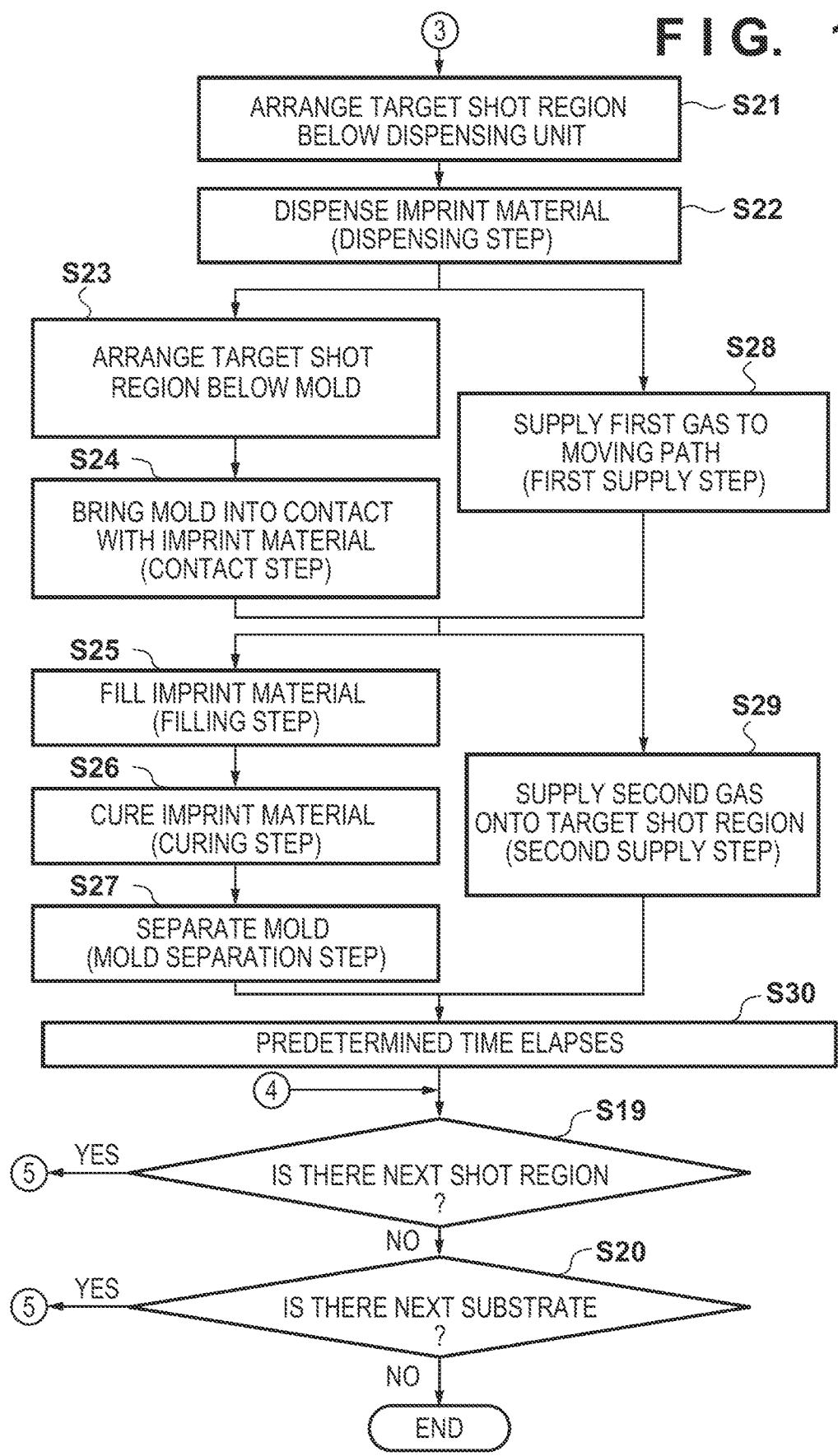
Figure 12:
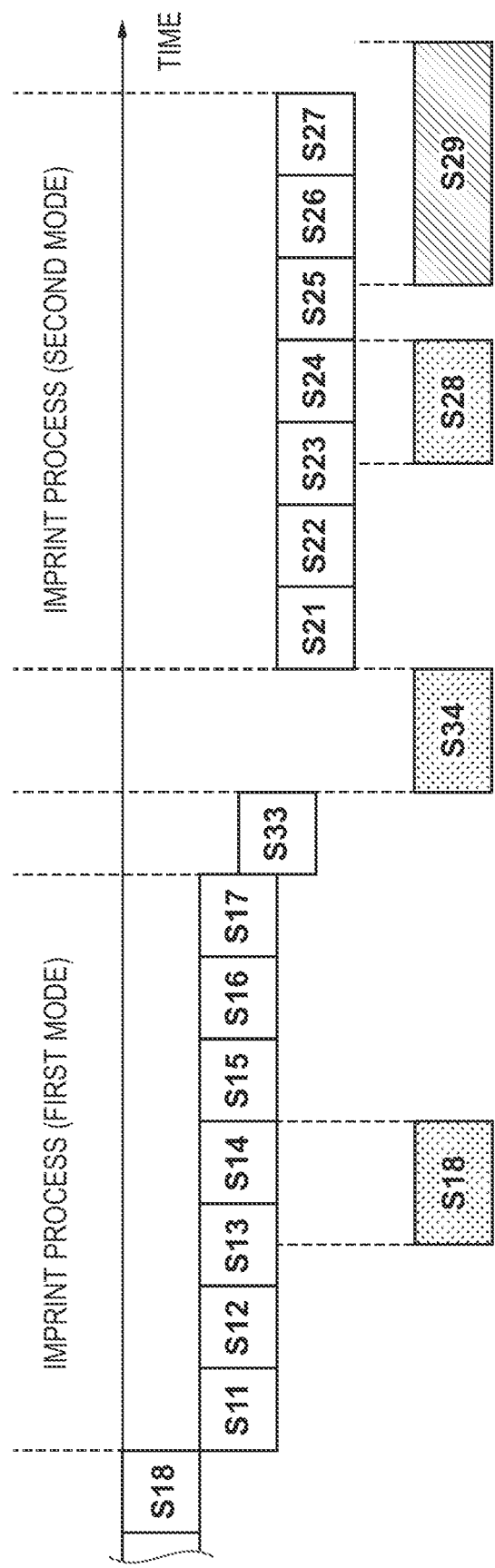
FIG. 12 is a timing chart showing the respective steps in the imprint method according to the fifth embodiment.

FIGS. 11A to 11B is a flowchart showing the imprint method according to this embodiment. The respective steps in the flowchart shown in FIGS. 11A to 11B can be controlled by a control unit 8. FIG. 12 shows an example of the timing chart showing the respective steps in the flowchart shown in FIGS. 11A to 11B, and the step numbers in FIG. 12 correspond to the step numbers of the respective steps in FIGS. 11A to 11B. Here, this embodiment is different from the first to fourth embodiments in that steps S32 to S34 are newly added, and the other steps are similar to those in the first to fourth embodiments. In the flowchart shown in FIGS. 11A to 11B, the imprint process in the second mode employs the first embodiment. However, the present invention is not limited to this, and any one of the second to fourth embodiments may be employed. Steps S32 to S34 different from those in the first to fourth embodiments will be described below.

In step S32, the control unit 8 determines whether the imprint apparatus has stopped. If the imprint apparatus has not stopped, the process advances to step S19. If the imprint apparatus has stopped, the process advances to step S33. In step S33, the control unit 8 determines whether the elapsed time since the mold separation step (step S17) is completed is equal to or larger than a threshold. The threshold can be set between 2 sec and 20 sec, for example. If the elapsed time since the mold separation step is completed is equal to or larger than the threshold, the process advances to step S34, and if the elapsed time is smaller than the threshold, the process returns to step S32.

In step S34, the control unit 8 executes the third supply step of supplying the third gas having a lower oxygen concentration than air onto the substrate. In this embodiment, the third supply step can be a step similar to the second supply step. That is, similar to the second gas, the filling promotion gas (first gas) can be applied as the third gas, but an inert gas such as nitrogen gas may also be applied. Further, the third gas is supplied by a supply unit 7 that supplies the filling promotion gas (first gas), but the present invention is not limited to this. The third gas may be supplied by the mechanism for supplying the second gas, or a mechanism for supplying the third gas may be provided separately from the supply unit 7.

As described above, in this embodiment, if the elapsed time since the mold separation step for the target shot region is completed is equal to or larger than the threshold, the third supply step is executed for the target shot region. With this operation, even if the imprint apparatus stops unexpectedly, the inhibition of the polymerization reaction of the imprint material that may occur after the mold separation step for the target shot region can be reduced, and the imprint material can be sufficiently cured.

<Embodiment of Method of Manufacturing Article>

A method of manufacturing an article according to an embodiment of the present invention is suitable for manufacturing an article, for example, a microdevice such as a semiconductor device or an element having a microstructure. The method of manufacturing the article according to this embodiment includes a step of forming a pattern on an imprint material supplied (dispensed) onto a substrate using the above-described imprint apparatus (imprint method), and a step of processing the substrate on which the pattern is formed in the preceding step. This manufacturing method further includes other known steps (oxidation, deposition, vapor deposition, doping, planarization, etching, resist separation, dicing, bonding, packaging, and the like). The method of manufacturing the article according to this embodiment is advantageous in at least one of the performance, the quality, the productivity, and the production cost of the article, as compared to a conventional method.

The pattern of a cured product formed using the imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured product is directly used as the constituent member of at least some of the above-described articles or used temporarily as a resist mask. After etching or ion implantation is performed in the substrate processing step, the resist mask is removed.

Figure 13A:
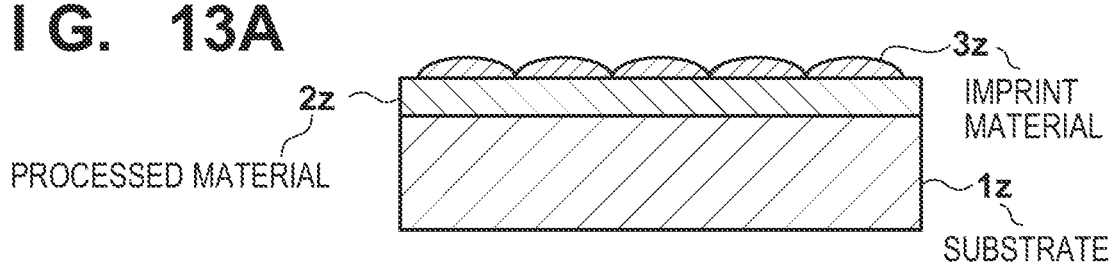
FIGS. 13A to 13F are views showing a method of manufacturing an article.

A detailed method of manufacturing an article will be described next. As shown in FIG. 13A, a substrate 1z such as a silicon wafer with a processed material 2z such as an insulator formed on the surface is prepared. Next, an imprint material 3z is applied to the surface of the processed material 2z by an inkjet method or the like. A state in which the imprint material 3z is applied as a plurality of droplets onto the substrate is shown here.

Figure 13B:
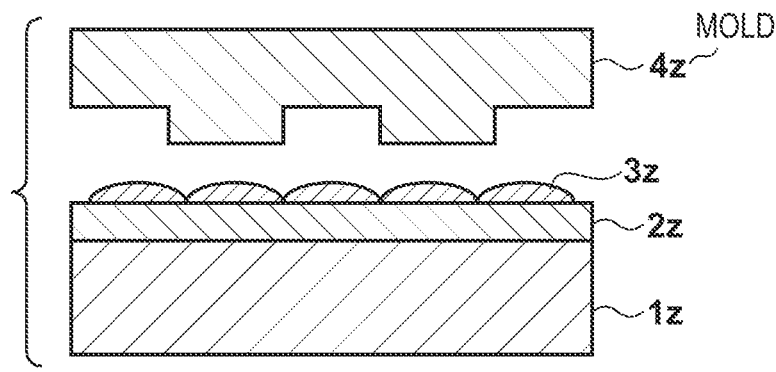
Figure 13C:
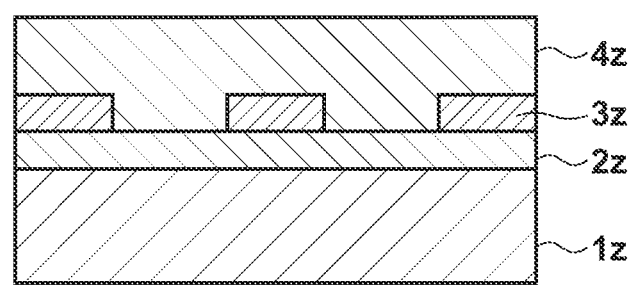

As shown in FIG. 13B, a side of a mold 4z for imprint with an uneven pattern is directed to and caused to face the imprint material 3z on the substrate. As shown in FIG. 13C, the substrate 1z to which the imprint material 3z is applied is brought into contact with the mold 4z, and a pressure is applied. The gap between the mold 4z and the processed material 2z is filled with the imprint material 3z. In this state, when the imprint material 3z is irradiated with energy for curing through the mold 4z, the imprint material 3z is cured.

Figure 13D:
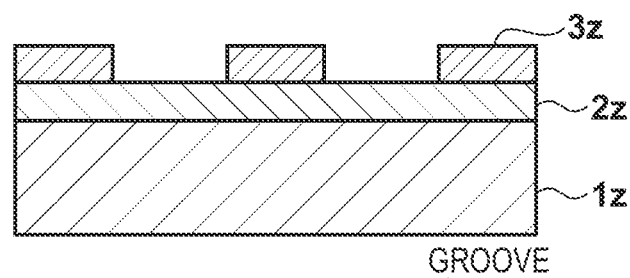

As shown in FIG. 13D, after the imprint material 3z is cured, the mold 4z is separated from the substrate 1z. Then, the pattern of the cured product of the imprint material 3z is formed on the substrate 1z. In the pattern of the cured product, the concave portion of the mold corresponds to the convex portion of the cured product, and the convex portion of the mold corresponds to the concave portion of the cured product. That is, the uneven pattern of the mold 4z is transferred to the imprint material 3z.

Figure 13E:
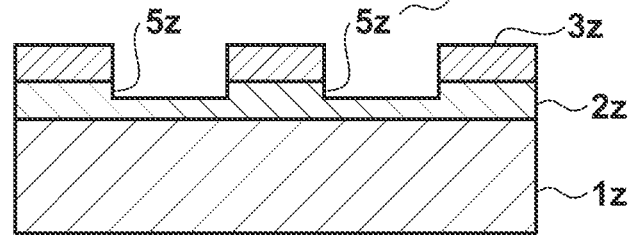
Figure 13F:
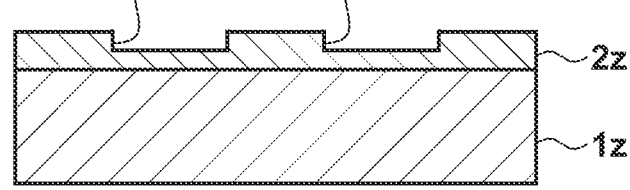

As shown in FIG. 13E, when etching is performed using the pattern of the cured product as an etching resistant mask, a portion of the surface of the processed material 2z where the cured product does not exist or remains thin is removed to form a groove 5z. As shown in FIG. 13F, when the pattern of the cured product is removed, an article with the grooves 5z formed in the surface of the processed material 2z can be obtained. Here, the pattern of the cured product is removed. However, instead of processing or removing the pattern of the cured product, it may be used as, for example, an interlayer dielectric film included in a semiconductor element or the like, that is, a constituent member of an article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-024693 filed on Feb. 14, 2019, which is hereby incorporated by reference herein in its entirety.

What is claimed is:

1. An imprint method that performs a process of forming a pattern of an imprint material on a substrate using a mold, for each of a plurality of shot regions on the substrate,
the process including:
dispensing the imprint material onto the substrate;
moving, to below the mold, the substrate on which the imprint material is dispensed; and
supplying, in a moving path of the substrate in the moving, a first gas that promotes filling of the imprint material into a pattern of the mold,
wherein in a case where a target shot region to be subjected to the process meets a predetermined condition, supplying a second gas having a lower oxygen concentration than air onto the substrate is additionally executed after the supplying the first gas, and in a case where the target shot region does not meet the predetermined condition, the supplying the second gas is not executed,
wherein the predetermined condition includes a condition that the target shot region is a shot region on which the process is performed last among the plurality of shot regions,
wherein the process further includes forming the pattern of the imprint material on the substrate by bringing the mold into contact with the imprint material on the substrate and curing the imprint material, and
wherein the supplying the second gas is executed in a period of the forming.

2. The method according to claim 1, wherein
the plurality of shot regions include a shot region array in which the process is continuously performed, and
the predetermined condition includes a condition that the target shot region is a shot region on which the process is performed last in the shot region array.

3. The method according to claim 1, wherein the forming includes separating the mold from the cured imprint material, and
the supplying the second gas is completed when the separating is started.

4. The method according to claim 1, wherein the supplying the second gas is executed continuously to the supplying the first gas.

5. The method according to claim 1, wherein
the process further includes:
forming the pattern of the imprint material on the substrate by bringing the mold into contact with the imprint material on the substrate and curing the imprint material, and further supplying the second gas.

6. The method according to claim 1, wherein the supplying the second gas is executed in a state in which the target shot region is arranged at a position where the second gas blown out from an outlet directly hits the target shot region.

7. The method according to claim 1, wherein the second gas includes components of the first gas.

8. The method according to claim 1, wherein
the process further includes separating the mold from the cured imprint material, and
in a case where an elapsed time since the separating for the target shot region is completed is not less than a threshold, supplying a third gas having a lower oxygen concentration than air onto the substrate is executed for the target shot region.

9. The method according to claim 1, wherein the first gas is a gas having high permeability with respect to the mold than air, or a gas that liquefies by condensation when the mold comes into contact with the imprint material on the substrate.

10. The method according to claim 1, wherein
the imprint material has a property that a polymerization reaction for curing is inhibited by oxygen,
the second gas is a gas for reducing inhibition of the polymerization reaction of the imprint material by oxygen.

11. The method according to claim 1, wherein the second gas includes all of the components of the first gas.

12. The method according to claim 1, wherein the second gas is an inert gas.

13. The method according to claim 1, wherein supplying the second gas is additionally executed after the supplying the first gas in the process for the target shot region meeting the predetermined condition.

14. The method according to claim 1, wherein the supplying the first gas is controlled such that a period during which the supplying the first gas is performed is the same between the plurality of shot regions.

15. The method according to claim 1, wherein
the plurality of shot regions includes a last shot region on which the process is performed last among the plurality of shot regions, and a non-last shot region different from the last shot region, and
the supplying the second gas is executed in the last shot region, and is not executed in the non-last shot region.

16. A manufacturing method of an article, including:
forming a pattern on a substrate using an imprint method defined in claim 1; and
processing the substrate with the pattern formed thereon in the forming,
wherein the article is manufactured from the substrate processed in the processing.

17. An imprint apparatus that performs a process of forming a pattern of an imprint material on a substrate using a mold for each of a plurality of shot regions on the substrate, the apparatus including:
a dispensing unit configured to dispense the imprint material onto the substrate;
a first supply unit configured to supply, in a moving path of the substrate in which the substrate on which the imprint material is dispensed by the dispensing unit is moved to below the mold, a first gas that promotes filling of the imprint material to a pattern of the mold; and
a control unit configured to control the process for each of the plurality of shot regions,
wherein the process includes supplying the first gas to the moving path by the first supply unit, and
in a case where a target shot region to be subjected to the process meets a predetermined condition, the control unit additionally executes supplying a second gas having a lower oxygen concentration than air onto the substrate after supplying the first gas, and in a case where the target shot region does not meet the predetermined condition, the control unit does not additionally execute supplying the second gas after supplying the first gas, wherein the predetermined condition includes a condition that the target shot region is a shot region on which the process is performed last among the plurality of shot regions wherein the process further includes forming the pattern of the imprint material on the substrate by bringing the mold into contact with the imprint material on the substrate and curing the imprint material, and wherein the supplying the second gas is executed in a period of the forming.

18. An imprint method that performs a process of forming a pattern of an imprint material on a substrate using a mold, for each of a plurality of shot regions on the substrate, the process including:

dispensing the imprint material onto the substrate;

moving, to below the mold, the substrate on which the imprint material is dispensed; and supplying, in a moving path of the substrate in the moving, a first gas that promotes filling of the imprint material into a pattern of the mold, wherein in a case where a target shot region to be subjected to the process meets a predetermined condition, supplying a second gas having a lower oxygen concentration than air onto the substrate is additionally executed after the supplying the first gas, and in a case where the target shot region does not meet the predetermined condition, the supplying the second gas is not executed, wherein the predetermined condition includes a condition that the target shot region is a shot region on which the process is performed last among the plurality of shot regions, and wherein the second gas is an inert gas.

* * * * *